United States Patent [19]

Mitake et al.

[11] 4,298,960

[45] Nov. 3, 1981

[54] MEMORY INTEGRATED CIRCUIT

[75] Inventors: Kenjiro Mitake; Osamu Kurakami, both of Tokyo, Japan

[73] Assignee: Nippon Electric Co., Ltd., Tokyo, Japan

[21] Appl. No.: 79,727

[22] Filed: Sep. 28, 1979

[30] Foreign Application Priority Data

Sep. 29, 1978 [JP] Japan ............................... 53/120880

[51] Int. Cl.³ ................................................ G11C 11/40
[52] U.S. Cl. ..................................... 365/210; 357/23; 365/174
[58] Field of Search ................... 357/23; 365/174, 210, 365/189

[56] References Cited

U.S. PATENT DOCUMENTS 4,052,229 10/1977 Pashley ................................. 357/23
4,138,740 2/1979 Itoh ...................................... 365/210

*Primary Examiner*—Terrell W. Fears
*Attorney, Agent, or Firm*—Sughrue, Mion, Zinn, Macpeak and Seas

[57] ABSTRACT

A memory circuit suitable for large scale integration is disclosed. The memory circuit comprises a plurality of memory cells each including a gate transistor having a gate coupled to one of word lines and a drain coupled to one of digit lines and capacitor means coupled between a source of the gate transistor and a potential source, wherein the threshold voltage of the gate transistors is made smaller than that of logic transistors employed in peripheral circuits.

19 Claims, 5 Drawing Figures

MEMORY INTEGRATED CIRCUIT

BACKGROUND OF THE INVENTION

The present invention relates to a memory integrated circuit, and more particularly to the so-called one-transistor type memory integrated circuit in which each memory cell is composed of one-transistor and one-capacitor.

In a memory circuit in which each memory cell is composed of a single gate transistor and a single capacitor, existence or non-existence of an electric charge stored in the capacitor is made to correspond to stored logic information. Recently, in accordance with the rapid increase of a memory capacity, individual memory cells are being reduced in size. As a result, the electrostatic capacitance of the capacitor in each memory cell has become remarkably small, and hence only a very small amount of electric charge can be stored therein. Consequently, a read-out signal from the memory cell has become very small and thus handling thereof has become difficult.

On the other hand, it has been known that if alpha particles from the outside of the subjected circuit chip, e.g. from a package of the chip a collide with a capacitor portion of the memory cell, a potential at the capacitor portion is lowered. If such collision of alpha particles with the capacitor portion arises in the aforementioned small-sized memory cell, then since the influence of the alpha particles upon the potential at the capacitor portion is relatively enlarged, a read-out voltage from the memory cell is lowered, resulting in reduction of the voltage difference from a reference voltage, and therefore, correct detection of the stored information becomes difficult. Moreover, transfer of a voltage between a capacitor in a memory cell and a digit line of a memory circuit is effected via a gate transistor in the memory cell, and upon the transfer from the capacitor to the digit line, the voltage at the capacitor is transferred to the digit line after it has been reduced by the amount corresponding to the threshold value of the gate transistor, so that the possibility of occurrence of the abovedescribed malfunction becomes larger. In addition, upon charging the capacitor in the memory cell with a given write-in voltage which is usually provided by power supply voltage, the voltage is applied to the capacitor via the gate transistor in the memory cell, and hence the net write-in voltage has been already lowered by the amount corresponding to the threshold value of the gate transistor. Therefore, the reduction of the read-out voltage level upon reading-out with respect to the write-in voltage level will be still increased.

In order to increase a write-in voltage applied to a memory cell and a read-out voltage therefrom as large as possible, a potential on a selected word line may be raised to a potential higher than a power supply potential level by a bootstrap or the like to make a gate transistor in a memory cell operate in an unsaturated region, to write-in the power supply potential level on a capacitor in the memory cell. However, according to such a method, if the number of memory cells coupled to a respective word line is increased, then a capacitor having a capacitance of several hundreds pico-farads or more is required for the bootstrap, and hence power consumption and the necessary area of the peripheral circuit as well as the bootstrap capacitor become undesirably large. Moreover, the operating speed of such a memory is limited by the operating period of the bootstrap circuit, and consequently, it is impossible to realize a high speed operation.

SUMMARY OF THE INVENTION

It is an object of the present invention to provide a memory integrated circuit suitable for high-density integration.

Another object of the present invention is to provide a memory integrated circuit in which stable read-out of information can be achieved without being influenced by alpha particles.

A memory circuit according to the present invention is characterized in that in a memory circuit whose memory cell is composed of a single transistor and a single capacitor, the threshold value of the memory transistor is made smaller in absolute value than a threshold value of logic transistors in a peripheral circuit.

According to the present invention, there is provided a memory circuit comprising a first digit line, a second digit line, a first word line, a second word line, a sense amplifier composed of first logic transistors of first threshold voltage, decoder means for operatively driving the first and second word lines, the decoder means being composed of second logic transistors of the first threshold voltage, a memory cell including a first gate transistor having a gate coupled to the first word line and a drain coupled to the first digit line and first capacitor means coupled between a source of the first gate transistor and a potential source and a dummy cell including a second gate transistor having a gate coupled to the second word line and a drain coupled to the second digit line and second capacitor means coupled between a source of the second gate transistor and the potential source, wherein the first and second gate transistors have threshold voltage smaller than first threshold voltage in absolute value.

According to the present invention, there is also provided a memory integrated circuit comprising a plurality of word lines, a plurality of digit lines, a plurality of memory cells disposed at respective intersections of the word lines and the digit lines including a gate transistor having a gate coupled to associated one of said word lines and a drain coupled to associated one of the digit lines, and capacitor means coupled between a source of the gate transistor and a potential source, means for operatively driving one of the word lines and means for detecting level of selected digit line wherein a threshold voltage of the gate transistor is larger than 0.3 volt, favorably 0.4 volt and smaller than those of transistors composing the driving means and the detecting means.

The term "logic transistor" as used throughout this specification and appended claim implies a transistor controlled by input signal or internal logic signals, but excludes a transistor such as a depletion type transistor that is constantly biased and serves as load means.

According to the present invention, owing to the fact that a threshold value of a gate transistor in a memory cell is made smaller than a threshold value of logic transistors in a peripheral circuit, upon transferring a voltage on a capacitor in a memory cell to a digit line of a memory circuit, a voltage drop across the gate transistor can be reduced, and therefore, even in the case of a small capacitor the voltage on the capacitor can be read-out effectively. While, since the logic transistors in the peripheral circuit are made to have a larger threshold value than the gate transistor in the memory cell, a sufficiently large logic threshold value for handling generally larger voltage signals than the memory cell can be given to the peripheral circuit, and thus it is possible to increase a noise margin.

In addition, according to the present invention, a lower limit of a threshold value of a gate transistor in a memory cell is determined depending upon a functional condition of holding an electric charge on a capacitor, and this lower limit is 0.3 V as will be described later.

Furthermore, the term "peripheral circuit" as used throughout this specification and appended claim is defined to mean all the remaining circuit including decoder circuits and sense amplifier circuit except for the memory cells.

BRIEF DESCRIPTION OF THE DRAWINGS

The above-mentioned and other features and advantages of the present invention will become more apparent by reference to the following description of its preferred embodiment taken in conjunction with the accompanying drawings, wherein.

DESCRIPTION OF THE PREFERRED EMBODIMENTS

Figure 1:
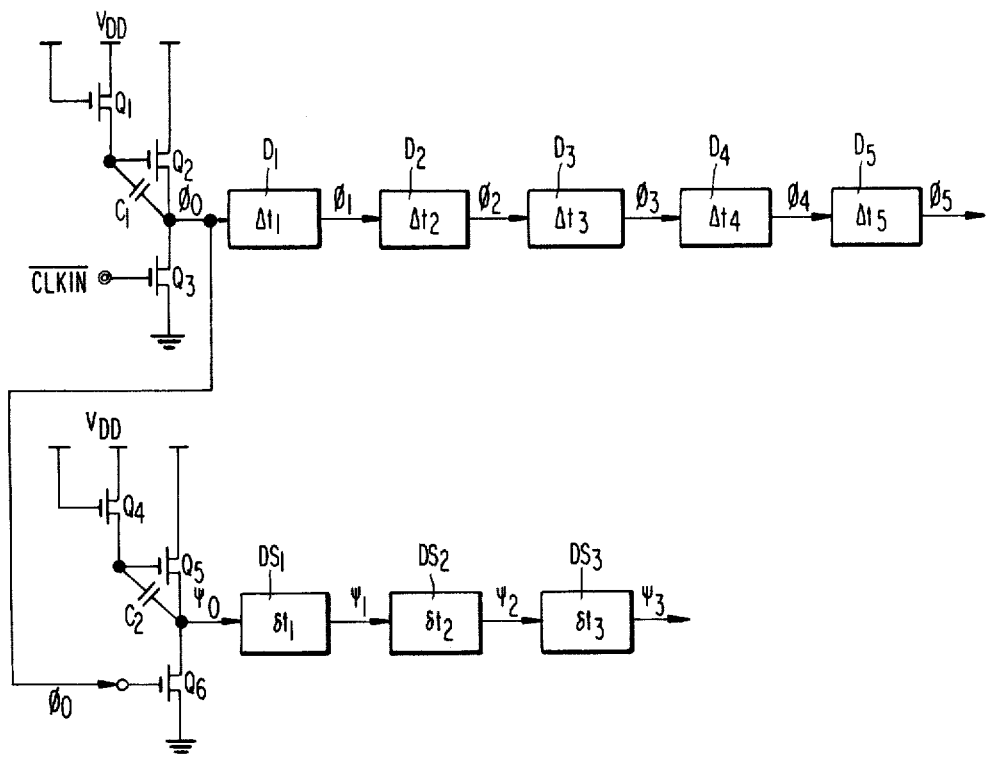
FIG. 1 is a block diagram showing a timing signal generator circuit of a memory.

Referring now to FIG. 1 of the drawings, a timing signal generator circuit for generating timing signals to be used in a dynamic memory is illustrated. A basic clock signal is externally-applied to a terminal CLKIN to be input to a bootstrap inverter circuit including N channel enhancement type insulated-gate field-effect transistors (hereinafter referred to as IGFET) $Q_1$ to $Q_3$ and a capacitor $C_1$, and at the output of the inverter circuit is derived a timing signal $\phi_0$. The timing signal $\phi_0$ is successively passed through delay circuits $D_1$ to $D_5$, and at the outputs of the respective delay circuits are derived a series of timing signals $\phi_1$ to $\phi_5$. In addition, the timing signal $\phi_0$ is input to another bootstrap inverter circuit including IGFETs $Q_4$ to $Q_6$ and a capacitor $C_2$, and at the output of the inverter circuit is derived an opposite-phase clock signal $\psi_0$. This clock signal $\psi_0$ is successively passed through delay circuits $DS_1$ to $DS_3$, and at the outputs of the respective delay circuits are derived a series of opposite-phase signals $\psi_1$ to $\psi_3$.

Figure 2:
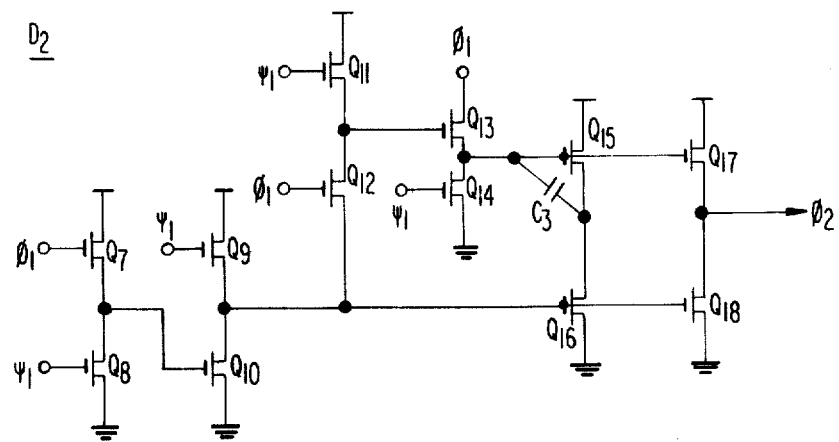
FIG. 2 is a schematic circuit diagram showing one example of a delay circuit shown in FIG. 1.

Among the delay circuits $D_1$ to $D_5$ and $DS_1$ to $DS_3$, by way of example, a detailed structure of the delay circuit $D_2$ is illustrated in FIG. 2. To the inputs of this delay circuit are applied the clock signal $\phi$, derived by the preceding delay circuit $D_1$ and the opposite-phase clock signal $\psi_1$, and at the output of this delay circuit is derived the opposite-phase clock signal $\phi_2$. It is to be noted that the other delay circuits are also constructed in the similar manner. Threshold values of IGFETs $Q_1$ to $Q_6$ in FIG. 1 and $Q_7$ to $Q_{18}$ in FIG. 2 are set to be 1.0 volt.

Figure 3:
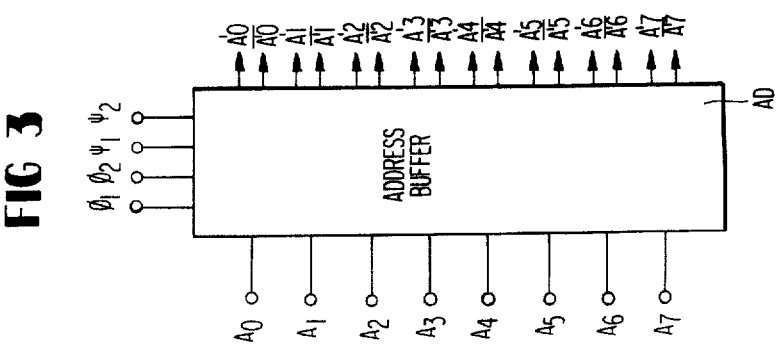
FIG. 3 is a block diagram showing an input-output relation of an address buffer.

In FIG. 3 is illustrated an address buffer to be used in the memory circuit according to the present invention. This address buffer AD is controlled by four clock signals $\phi_1$, $\phi_2$, $\psi_1$ and $\psi_2$ so as to generate true and complementary output signals $A_0'$, $\overline{A_0}'$, $A_1'$, $\overline{A_1}'$ ... $A_7'$, $\overline{A_7}'$ in response to address input signals $A_0$, $A_1$, ... $A_7$, respectively. The address buffer AD also employs N channel IGFET having the same threshold value of 1.0 volt.

Figure 4:
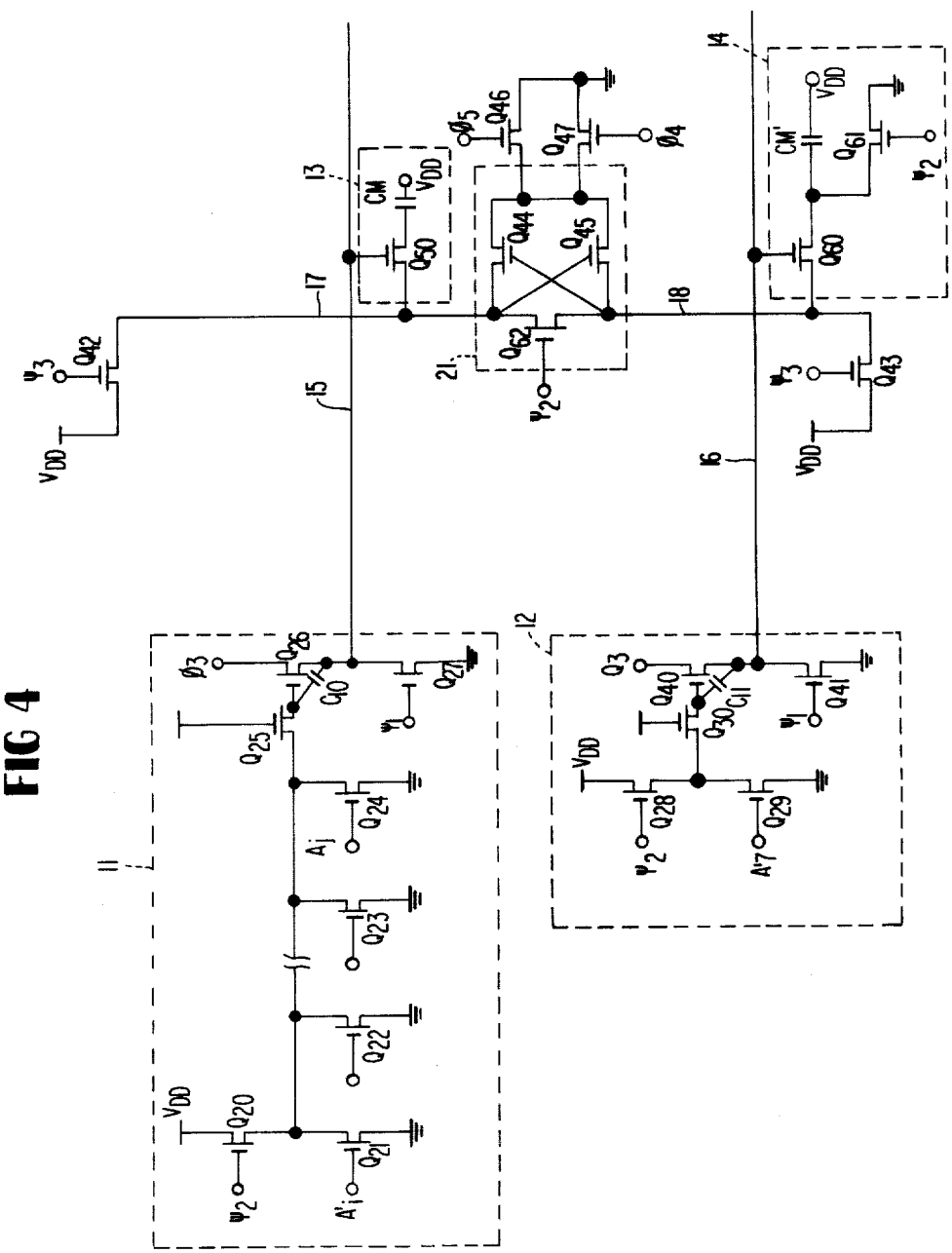
FIG. 4 is a schematic circuit diagram showing a memory circuit according to the present invention.

FIG. 4 shows central portion of a memory circuit including a memory cell, a sense amplifier and a word decoder. A word decoder 11 is composed of a NOR circuit consisting of an IGFET $Q_{20}$ serving as a dynamic load and input IGFETs $Q_{21}$ to $Q_{24}$, and a bootstrap output circuit consisting of IGFETs $Q_{25}$ to $Q_{27}$ and a bootstrap capacitor $C_{10}$. To the gates of the input IGFETs $Q_{21}$ to $Q_{24}$ are applied selected ones of the address output signals $A_0'$, $\overline{A_0}'$, $A_1'$, $\overline{A_1}'$, ... $A_7'$, $\overline{A_7}'$. The output of the word decoder 11 is coupled to a word line 15. A dummy word decoder 12 receives one address input (for instance, $A_7'$) to drive a dummy word line 16. To the word line 15 is connected a gate of a gate IGFET $Q_{50}$ in a memory cell 13. The memory cell 13 is composed of an information storage capacitor CM having one end connected to a power supply $V_{DD}$ and the gate IGFET $Q_{50}$ interposed between the other end of the capacitor CM and a digit line 17. The digit line 17 is connected to the power supply $V_{DD}$ via a precharging IGFET $Q_{42}$. On the other hand, at a cross-point between a dummy word line 16 and a digit line 18 is disposed a dummy cell 14. The dummy cell 14 is composed of an electric charge storage capacitor CM', an electric charge discharging IGFET $Q_{61}$ and a transfer gate IGFET $Q_{60}$. The digit lines 17 and 18 are respectively coupled to sense nodes 19 and 20 of a sense amplifier 21. The sense amplifier comprises a pair of cross-coupled IGFETs $Q_{44}$ and $Q_{45}$, IGFETs $Q_{46}$ and $Q_{47}$ for activating the sense amplifier, and an equalizer IGFET $Q_{62}$.

IGFET $Q_{21}$ to $Q_{47}$, $Q_{61}$ and $Q_{62}$ are N channel IGFETs having the same threshold value of 1.0 volt. While IGFETs $Q_{50}$ and $Q_{60}$ are N channel IGFETs having the same threshold value of 0.5 volt.

In operation, in response to the timing signal $\psi_2$, IGFET $Q_{62}$ becomes conductive to equalize the potentials of the digit lines 17 and 18. Then, in response to the timing a signal $\psi_3$, precharging IGFETs $Q_{42}$ and $Q_{43}$ become conductive to charge the digit line 17 and 18.

After precharging, in response to the address output signals fed from the address buffer AD (FIG. 3) the output states of the word decoder 11 and the dummy word decoder 12 are determined, and thus a selected word line (for example, word line 15) and a selected dummy word line (for example, dummy word line 16) have their potential raised up to the power supply potential level $V_{DD}$. Due to the potential rise on the word line 15 as well as the dummy word line 16, the gate IGFET $Q_{50}$ in the memory cell 13 and the gate IGFET $Q_{60}$ in the dummy cell 14 become conducting, and hence the potentials on the digit lines 17 and 18 will change to the potential levels corresponding to the electric charges stored in the capacitors CM and CM', respectively. The level of the digit line subjected to such a level change is amplified to be readout or refreshed by the sense amplifier 21 in response to the clock signals $\phi_4$ and $\phi_5$.

According to the present invention, the threshold value of the IGFETs $Q_{50}$ and $Q_{60}$ in the memory cell 13 and the dummy cell 14, respectively, is selected smaller in absolute value than that of the logic IGFETs in the peripheral circuit. The threshold value of the logic IGFETs in the peripheral circuit cannot be preset lower than a certain value. More particularly, in the case where the signals input to these logic IGFETs are subjected to influences of coupling between the signals, in phase noise at the output of the address buffer, etc., if the threshold value of these logic IGFETs is too low, then a malfunction will occur. Furthermore, among those logic transistors such transistors that directly receive external input signals are required to be perfectly turned OFF for an input potential level equal to or less than 0.8 V that is the lower level of the TTL levels. Therefore, the threshold value of such logic IGFETs in the peripheral circuit is favorably at about 0.8 V or more. In the illustrated embodiment of the present invention, the threshold value of the logic IGFETs in the peripheral circuit was selected at about 1 V. On the other hand, the threshold value of the gate IGFETs in the memory cell and the dummy cell in the illustrated embodiment was selected at 0.5 V. A gate IGFET in a memory cell is required to have the function of holding an electric charge stored on a capacitor. In general, a source-drain leakage current in a gate IGFET is about $10^{-12}$ A. Evaluating a threshold value of IGFET whose sub-threshold current for 0 V is $10^{-12}$ A on the basis of this fact, it becomes 0.3 to 0.4 V. Accordingly, an IGFET having a threshold value that is 0.3 V, favorably 0.4 V or higher and that is smaller in absolute value than the threshold value of the logic IGFETs in the peripheral circuit, is employed as the gate circuit in the memory cell and dummy cell.

According to the above-described embodiment of the present inventions, since the threshold value of the gate transistor in the memory cell is selected at 0.5 V, in the case where the power supply voltage $V_{DD}$ is chosen to be 5 V, the write voltage applied to the capacitor in the memory cell via the gate IGFET is 4.5 V (=5 V−0.5 V). Whereas, in the case of the memory circuit in the prior art, since the threshold value of the gate IGFET in the memory cell is the same value of 1 V as the threshold value of the logic IGFETs in the peripheral circuit, the write voltage applied to the capacitor in the memory cell is 4 V (=5 V−1 V).

In general, if one alpha particle collides with a capacitor in a memory cell, about 0.03 pico-coulomb of electric charge is lost from the electric charge of the capacitor in the memory cell. When this phenomenon is applied to a memory where a capacitor in a memory cell has a capacitance of 0.06 PF as a general value, the voltage stored in the capacitor is reduced by about 0.5 V due per one alpha particle.

Accordingly, in the case of the memory cell according to the above-described embodiment, a voltage of 4 V can still be held on the capacitor even if an alpha particle collides with the capacitor, and hence, normal read-out is made possible.

Figure 5:
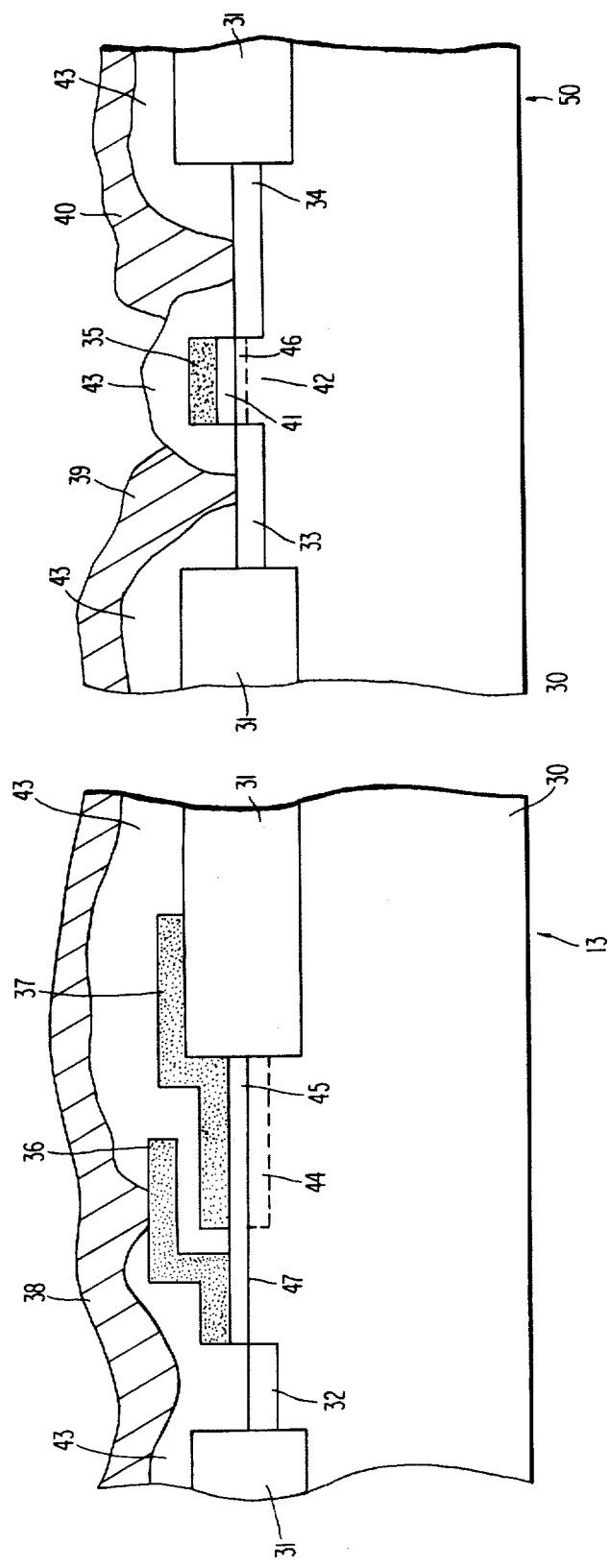
FIG. 5 is a cross-section view showing a memory cell and a transistor in a peripheral circuit to be used according to the present invention.

Now one example of a semiconductor chip structure including a memory cell as well as a logic IGFET in a peripheral circuit will be explained with reference to FIG. 5. A P-type semiconductor substrate 30 having a specific resistance 6~8 ohm-cm is employed, in which a memory cell 13 is formed in a region defined by a field oxide film 31 of a thickness about 1 μm. The memory cell 13 includes an N-type region 32 of an impurity concentration $10^{19}$–$10^{21}$ atms.cm$^{-3}$ serving as a drain of a gate IGFET (Q$_{50}$), a thin gate insulator film 45 made of SiO$_2$ of 800 Å, a polycrystalline silicon layer 36 having a thickness of 5000 Å serving as a gate electrode and a polycrystalline silicon layer 37 of a thickness 5000 Å as an electrode of a capacitor. The polycrystalline silicon layer 36 is connected to a word line wiring layer 38 as of aluminium formed on a silicon oxide layer 43. The polycrystalline silicon layer 37 is biased by a power supply voltage, and a capacitor (CM) is formed between the polycrystalline silicon layer 37 and the thus produced inversion layer 44. This inversion layer 44 also functions as a source of the gate IGFET. In this memory cell, the threshold value of the gate IGFET constructed with the gate electrode 36, the drain 32 and the inversion layer 44 becomes about 0.5 volt. On the other hand, an IGFET 50 in the peripheral circuit comprises hand, an N-type source region 33, an N-type drain region 34, a gate insulator film 41 made of SiO$_2$ having a thickness of 800 Å, and a gate electrode 35 made of a polycrystalline silicon of a thickness 5000 Å, the regions 33 and 34 having an impurity concentration of $10^{19}$–$10^{21}$ atoms.cm$^{-3}$, and in the illustrated semiconductor structure, boron ion or the like ion which provides P-type conductivity with semiconductor material is implanted by an accelerated voltage at 50 Ke V into a channel region to form an ion-implanted region 46 having boron ion concentration at a dose level $2.5 \times 10^{11}$ atms.cm$^{-2}$ and a thickness of 2000 Å. As a result, the threshold value of this transistor 50 is made higher than the threshold value of the gate IGFET in the memory cell. The value of the threshold voltage of this IGFET 50 is 1.0 volt.

It is to be noted that the method for reducing the threshold value of the gate transistor in the memory cell lower than the threshold value of the transistor in the peripheral circuit is not limited to the above-mentioned example, but it could be achieved by other methods such as by varying the thickness or kind of the gate insulator film. For example, in place of the above ion-implantation to the gate region 42, the same result can be obtained by making the thickness of the gate insulator film 41 for larger than that of the gate insulator film 45, where typical example of thickness of the gate insulator film 41 is made 1600 Å while the thickness of the gate insulator film 45 remains 800 Å. Another useful method for making the threshold voltage of the gate IGFET in the memory all 13 smaller than that of IGFET 50 is to make use of a silicon-nitride (Si$_3$N$_4$) film as the gate insulator film 45, in place of the ion-implentation. In other words, where the insulator film 45 of the memory transistor is made of the silicon-nitride film of 1600 Å thickness and the insulator film 41 of the peripheral transistor is made of the silicon dioxide (SiO$_2$) film of 1600 Å thickness while the impurity concentrations of the substrate 30 and respective N-type regions 32 to 34 are the same as the case of the above-mentioned embodiment, the same relationship of the threshold voltages of the memory and peripheral transistors as that of the above-mentioned embodiment is obtained. Still another useful method is to implant phosphorus ion or the like ions which provides N-type conductivity with semiconductor material, into the channel region 47 of the memory transistor (gate IGFET) to form the ion-implantation region therein in place of the ion-implantation to the channel region 42. In this case the gate insulator films 42 and 45 are made of silicon dioxide film of 1600 A thickness and the impurity concentrations of respective semiconductor regions are the same as in the case of FIG. 5. The dose quantity of the implanted phospherus ions in the channel region 47 is about $2.5 \times 10^{11}$ atoms.cm$^{-2}$ which is smaller than the original impurity concentration of the substrate. As a result, the P-type conductivity of the substrate is weakened, thereby making the threshold voltage of the memory transistor smaller than that of the peripheral transistor.

Further, a combination of the above described methods or another method may also be useful for the present invention.

We claim:

1. A memory circuit comprising:
   a first digit line;
   a second word line;
   decoder means for operatively driving said first and second word lines, said decoder means being comprised of transistors having a first threshold voltage;
   a memory cell including a first gate transistor having a gate coupled to said first word line and a drain coupled to said first digit line, and first capacitor means coupled between a source of said gate transistor and a potential source; and
   a dummy cell including a second gate transistor having a gate coupled to said second word line and a drain coupled to said second digit line and a second capacitor means coupled between a source of said second gate transistor and said potential source;
   wherein said first and second gate transistors are of the same channel type as that of said decoder transistors and have a second threshold voltage of the same polarity as that of said first threshold voltage, said second threshold voltage being smaller in absolute value than said first threshold voltage.

2. A memory circuit comprising a peripheral circuit composed of logic transistors having a first threshold voltage, and a plurality of memory cells each of which includes (i) a gate transistor having a second threshold voltage of the same polarity as that of said first threshold voltage, and second threshold voltage being smaller in absolute value than said first threshold voltage and (ii) a capacitor for storing logic information.

3. An integrated circuit memory comprising:
   a plurality of word lines;
   a plurality of digit lines;
   a plurality of memory cells disposed at respective intersections of said word lines and said digit lines, each of said memory cells including (i) a gate transistor having a gate coupled to the associated one of said word lines and a drain coupled to the associated one of said digit lines and (ii) capacitor means coupled between a source of said gate transistor and a potential source;
   means for operatively driving one of said word lines; and
   means for detecting a change in level of selected digit line;
   wherein a threshold voltage of said gate transistor is larger than 0.3 volt and smaller in absolute value than that of transistors employed in said driving means and said detecting means, the channel type of said gate transistors being the same as that of said transistors employed in said driving means and detecting means.

4. The memory according to claim 1 or 2, wherein said second threshold voltage is larger than 0.3 volt in absolute value.

5. The memory according to claim 1, 2 or 3, wherein all of said transistors are insulated-gate field-effect transistors.

6. The memory according to claim 1 further including a sense amplifier coupled to said first and second digit lines, said sense amplifier being comprised of transistors having said first threshold voltage.

7. The memory circuit according to claim 1, wherein said first threshold voltage is at least 0.8 volt in absolute value.

8. The memory circuit according to claim 3, wherein said transistors employed in said driving means and said detecting means have a threshold voltage more than 0.8 volt in absolute value.

9. The memory according to claim 1 or 2, wherein said second threshold voltage is larger than 0.4 volt in absolute value.

10. The circuit according to claim 1, in which each of said first and second capacitors includes a first electrode of polycrystalline silicon and a second electrode made of inversion layer present at the surface of a semiconductor substrate.

11. The circuit according to claim 10, in which the gates of said first and second transistors are formed to polycrystalline silicon.

12. The circuit according to claim 2, in which each of said logic transistors includes a channel region defined at a surface of a semiconductor substrate, said channel region having an impurity of the same conductivity type as that of said substrate with a higher concentration than said substrate.

13. A semiconductor memory device comprising a semiconductor substrate of a first conductivity type, a plurality of first transistors formed on said semiconductor substrate, a plurality of second transistors formed on said semiconductor substrate, the channel conductivity type of said second transistors being the same as that of said first transistors, said first transistors operating as logic transistors in a peripheral circuit, each of said second transistors operating as a transfer gate transistor of a memory cell, the threshold voltage of said first transistors being larger in absolute value than that of said second transistors.

14. The device according to claim 13, further comprising a plurality of capacitors, each of said capacitors associated with one of said second transistors thereby to form the memory cell.

15. The device according to claim 14, in which the conductivity of the channel region of said second transistors is weaker than the channel region of said second transistors.

16. The device according to claim 13, in which an impurity of said first conductivity type is introduced to the channel region of said first transistors.

17. The device according to claim 13, in which an impurity of a second conductivity type opposite to said first conductivity type is introduced to the channel region of said second transistors.

18. The device according to claim 13, in which gates of said first and second transistors are made of polycrystalline silicon.

19. The devide according to claim 13, in which the gate insulator film of said second transistors is thinner than that of said first transistors.

* * * * *